United States Patent
Yuan et al.

(10) Patent No.: US 10,212,847 B1
(45) Date of Patent: Feb. 19, 2019

(54) AIR GUIDING DUCT, CASING, AND ELECTRONIC DEVICE USING THE SAME

(71) Applicant: HONGFUJIN PRECISION ELECTRONICS (TIANJIN) CO., LTD., Tianjin (CN)

(72) Inventors: Yan-Ni Yuan, Tianjin (CN); Ying-Jie Duan, Tianjin (CN); Gong-Wen Zhang, Tianjin (CN); Han-Yu Li, New Taipei (TW)

(73) Assignee: HONGFUJIN PRECISION ELECTRONICS (TIANJIN) C, Tianjin (CN)

( * ) Notice: Subject to any disclaimer, the term of this patent is extended or adjusted under 35 U.S.C. 154(b) by 0 days.

(21) Appl. No.: 15/952,496

(22) Filed: Apr. 13, 2018

(30) Foreign Application Priority Data

Dec. 22, 2017 (CN) .......................... 2017 1 1414934

(51) Int. Cl.
H05K 7/20 (2006.01)

(52) U.S. Cl.
CPC ..... *H05K 7/20145* (2013.01); *H05K 7/20172* (2013.01); *H05K 7/20736* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,300,405 B2* | 10/2012 | Sun | ........................... | G06F 1/20 165/185 |
| 2011/0080700 A1* | 4/2011 | Bland | ....................... | G06F 1/20 361/679.5 |
| 2012/0031272 A1* | 2/2012 | Rubit | ..................... | B01D 45/06 95/287 |
| 2012/0212906 A1* | 8/2012 | Chang | ....................... | G06F 1/20 361/695 |
| 2012/0325358 A1* | 12/2012 | Lin | ........................... | G06F 1/20 138/103 |
| 2013/0148290 A1* | 6/2013 | Chen | ........................ | G06F 1/20 361/679.46 |
| 2014/0126146 A1* | 5/2014 | Han | ................... | H05K 7/20145 361/695 |
| 2014/0146471 A1* | 5/2014 | Liu | .................... | H05K 7/20727 361/695 |
| 2014/0293532 A1* | 10/2014 | Schelshorn | ........ | H05K 7/20145 361/679.53 |
| 2014/0364046 A1* | 12/2014 | Li | ...................... | H05K 7/20145 454/184 |
| 2016/0192538 A1* | 6/2016 | Yang | .................. | H05K 7/20145 361/692 |

* cited by examiner

*Primary Examiner* — Lisa Lea Edmonds
(74) *Attorney, Agent, or Firm* — ScienBiziP, P.C.

(57) ABSTRACT

An air guiding duct and casing providing easy access for fan maintenance and electronic devices using the air guiding duct are disclosed. The air guiding duct includes a first guiding plate and a second guiding plate. The first guiding plate includes a first pivoting portion and first extension panels. The second guiding plate includes a second pivoting portion and second extension panels. The first guiding plate is rotatably connected to the second guiding plate, and can be in a first position to align with the second guiding plate and join each first extension panel with a second extension panel, to define air guiding channels for heat dissipation, and a second position, where the first guiding plate is tilted with a predetermined angle relative to the second guiding plate.

18 Claims, 5 Drawing Sheets

AIR GUIDING DUCT, CASING, AND ELECTRONIC DEVICE USING THE SAME

FIELD

The subject matter herein generally relates to air guiding duct, casing, and electronic devices using the air guiding duct.

BACKGROUND

Computer systems, such as servers, can be expanded by expansion cards but an internal space of a server is limited. In order to meet heat dissipating demands, heat dissipating devices perform the critical function of removing heat from a computer system. For example, a heat sink is provided to efficiently dissipate heat generated by a CPU, and an air guiding duct is provided to direct air out of the computer system. Due to the functional requirements, air ducts are often in the middle of the server, fans are located in an lower portion of the server, while expansion cards, cables, and other components are in the upper portions of the server. Thus, the expansion cards, cables, and other components need to be removed during the maintenance of the fans. An air guiding duct and electronic devices using the air guiding duct that can provide easy maintenance of fans would be needed.

BRIEF DESCRIPTION OF THE DRAWINGS

Implementations of the present disclosure will now be described, by way of example only, with reference to the attached figures.

DETAILED DESCRIPTION

Figure 1:
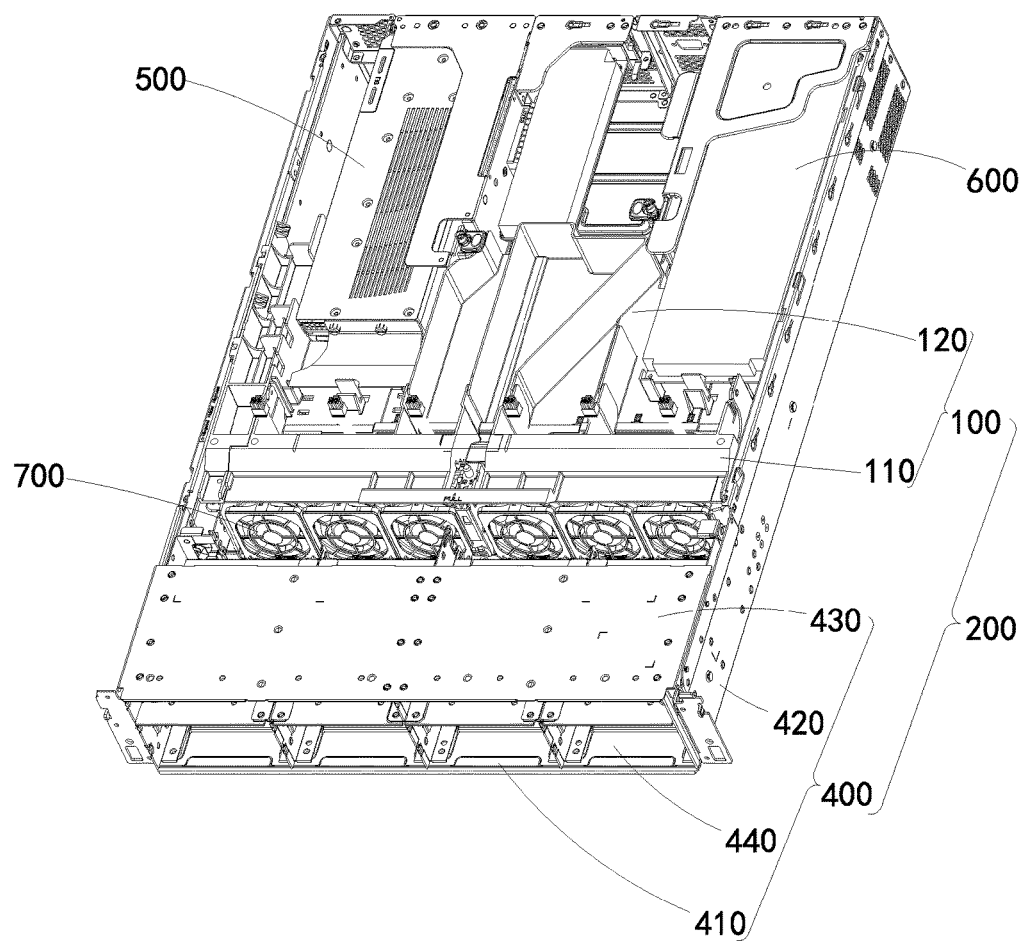
FIG. 1 illustrates an isometric view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

FIG. 1 illustrates an electronic device 300. The electronic device 300 includes a casing 200, a first electronic component 500, a second electronic component 600, and a plurality of cooling fans 700.

The casing 200 includes a chassis 400 and an air guiding duct 100.

The chassis 400 defines an air intake 440. Inlet sides of the cooling fans 700 are in air communication with the air intake 440, and outlet sides of the cooling fans 700 are in air communication with the first electronic component 500 and the second electronic component 600 through the air guiding duct 100.

Cooling air generated by the cooling fans 700 is guided to the first electronic component 500 and the second electronic component 600 through the air guiding duct 100 to cool the first electronic component 500 and the second electronic component 600.

Figure 2:
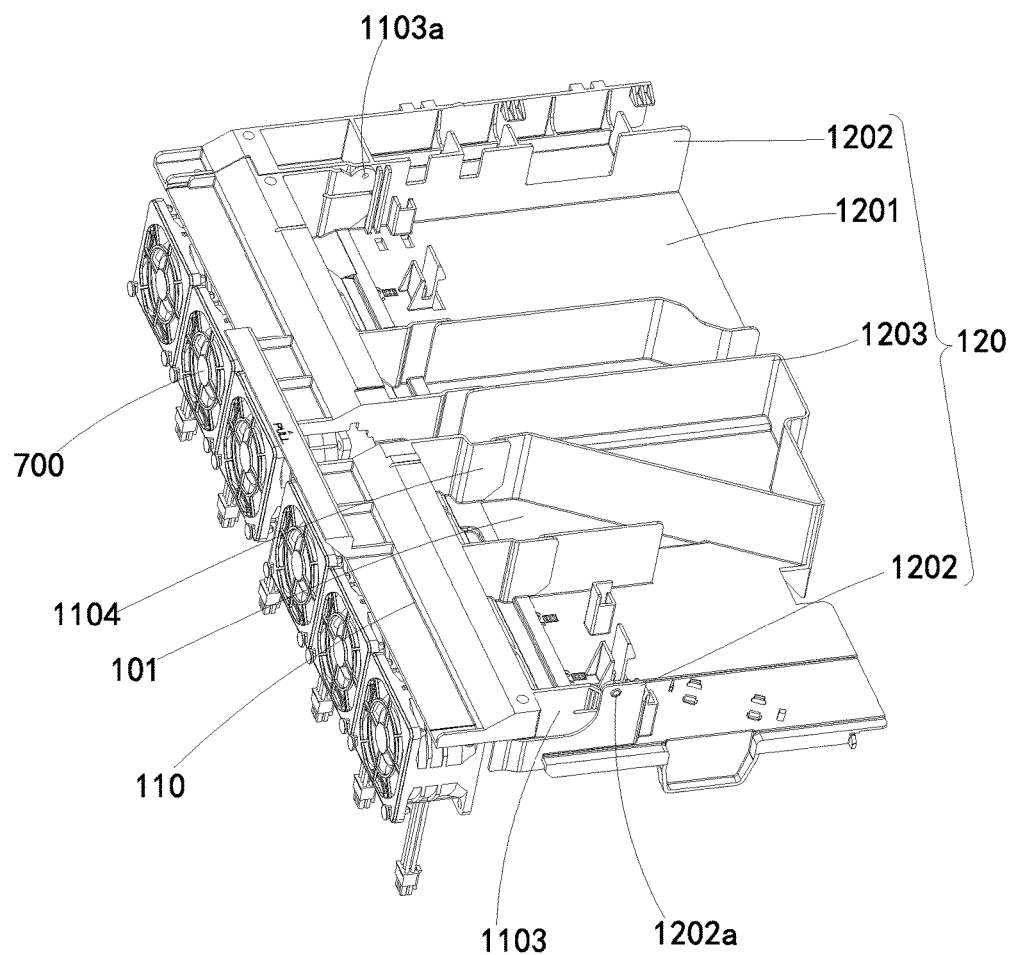
FIG. 2 illustrates an air guiding duct and fans of the electronic device of FIG. 1.

Referring to FIGS. 2-5, the air guiding duct 100 includes a first guiding plate 110 and a second guiding plate 120 as shown in FIG. 2.

The first guiding plate 110 includes a first pivoting portion 1103a and a plurality of first extension panels 1104. The second guiding plate 120 includes a second pivoting portion 1202a and a plurality of second extension panels 1203 corresponding to the plurality of first extension panels 1104.

Figure 3:
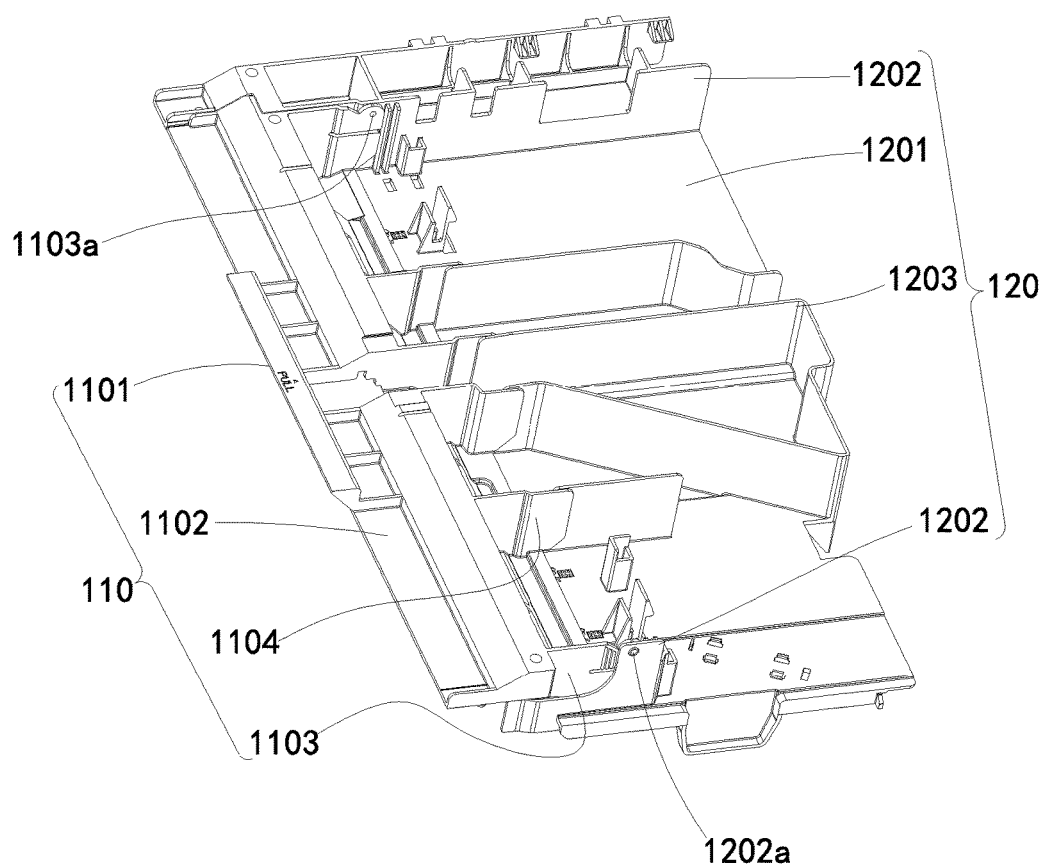
FIG. 3 illustrates the air guiding duct of the electronic device of FIG. 1.
Figure 4:
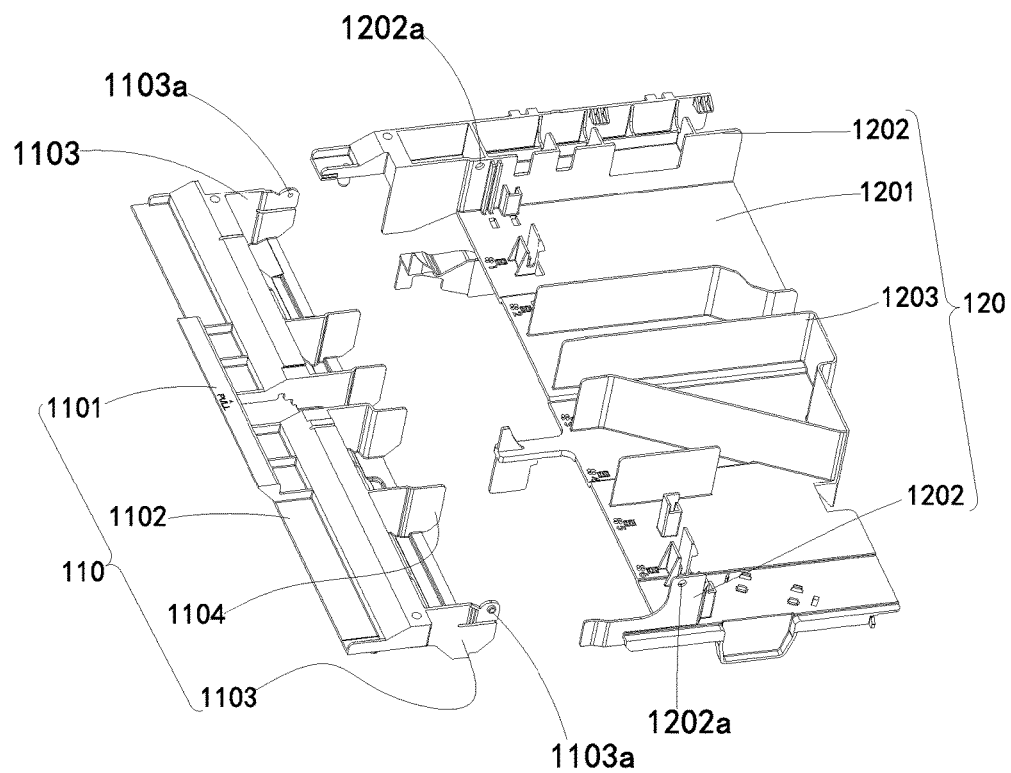
FIG. 4 illustrates an exploded view of the air guiding duct of FIG. 3.
Figure 5:
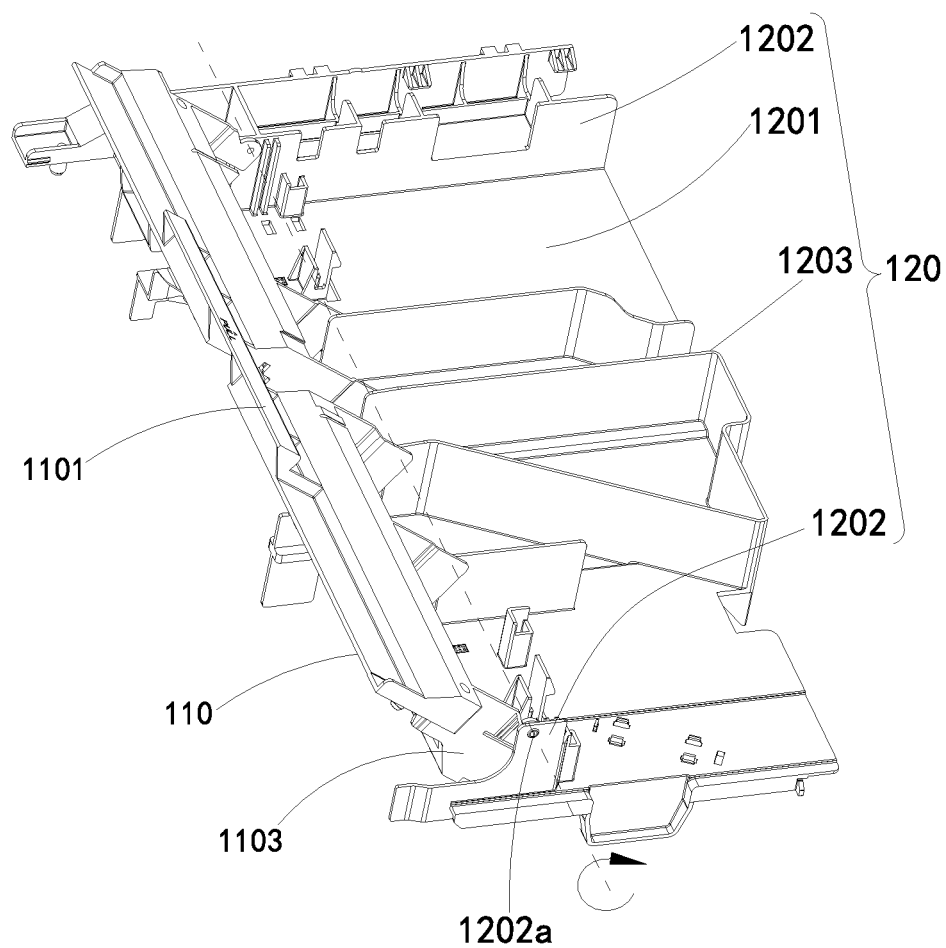
FIG. 5 illustrates the air guiding duct of FIG. 3, showing a first cover in a different position.

The first guiding plate 110 is rotatably connected to the second guiding plate 120. The first guiding plate 110 is rotatable between a first position (as shown in FIG. 3), and a second position (as shown in FIG. 5). In the first position, the first guiding plate 110 is aligned with the second guiding plate 120 and each first extension panel 1104 contacts a second extension panel 1203, and the first extension panels 1104 and the second extension panels 1203 define a plurality of air guiding channels 101 for the cooling air to pass through. In the second position, the first guiding plate 110 is tilted with a predetermined angle relative to the second guiding plate 120.

The first electronic component 500, the second electronic component 600, and the plurality of cooling fans 700 are mounted to the chassis 400, and the plurality of cooling fans 70 can be located between the chassis 700 and the first guiding plate 110.

When the first guiding plate 110 is rotated to the first position, the plurality of cooling fans 700 is enclosed by the first guiding plate 110, and when the first guiding plate 110 is rotated to the second position, the cooling fans 700 are exposed and can be easily maintained.

Referring to FIG. 1, the chassis 400 can include a bottom plate 410, two side plates 420 perpendicularly connected to two opposing sides of the bottom plate 410, and a top plate 430 parallel with the bottom plate 410. The air intake 440 can be defined on a same side of the bottom plate 410, the side plates 420 and the top plate 430.

In at least one exemplary embodiment, the first guiding plate 110 can include a first air guiding panel 1102 and at least one third extension panel 1103 connected to an edge of the first air guiding panel 1102 as shown in FIG. 3.

Each third extension panel 1103 includes a first pivoting portion 1103a. The first extension panels 1104 are connected to a same side of the first air guiding panel 1102.

Correspondingly, the second guiding plate 120 includes a second air guiding panel 1201 and at least one fourth extension panel 1202 connected to an edge of the second air guiding panel 1201.

Each fourth extension panel 1202 includes a second pivoting portion 1202*a*. The second extension panels 1203 are connected to a same side of the second air guiding panel 1201.

For example, the first guiding plate 110 includes two third extension panels 1103 connected perpendicularly to two respective opposing edges of the first air guiding panel 1102. The second guiding plate 120 includes two fourth extension panels 1202 connected perpendicularly to two respective opposing edges of the second air guiding panel 1201. Each third extension panel 1103 is rotatably connected to a fourth extension panel 1202 through the first pivot portion 1103*a* and the second pivot portion 1202*a*.

The first pivot portion 1103*a* can be a pivot pin, and the second pivot portion 1202*a* can be a pivot hole for the pivot pin, or the second pivot portion 1202*a* can be a pivot pin and the first pivot portion 1103*a* can be a pivot hole for the pivot pin.

The first guiding plate 110 can further include a handle 1101, the handle 1101 is connected to a peripheral side of the first air guiding panel 110.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. An air guiding duct comprising:
   a first guiding plate comprising:
      a first pivoting portion; and
      a plurality of first extension panels; and
   a second guiding plate comprising:
      a second pivoting portion; and
      a plurality of second extension panels correspondingly align with the plurality of first extension panels;
   wherein the first guiding plate is rotatably connected to the second guiding plate, and the first guiding plate is rotatable between a first position and a second position, the first position is when the first guiding plate aligns with the second guiding plate, each first extension panel contacts a corresponding second extension panel, and the first extension panels and the second extension panels define a plurality of air guiding channels, the second position is where the first guiding plate is tilted at a predetermined angle relative to the second guiding plate.

2. The air guiding duct of claim 1, wherein the first guiding plate comprises:
   a first air guiding panel; and
   at least one third extension panel connected to an edge of the first air guiding panel;
   wherein each of the at least one third extension panel comprises a first pivoting portion; the plurality of first extension panels are connected to a same side of the first air guiding panel.

3. The air guiding duct of claim 2, wherein the second guiding plate comprises:
   a second air guiding panel; and
   at least one fourth extension panel connected to an edge of the second air guiding panel;
   wherein each of the at least one fourth extension panel comprises a second pivoting portion; the plurality of second extension panels are connected to a same side of the second air guiding panel.

4. The air guiding duct of claim 3, wherein the first guiding plate comprises two third extension panels perpendicularly connected to two respective opposing edges of the first air guiding panel; the second guiding plate comprises two fourth extension panels perpendicularly connected to two respective opposing edges of the second air guiding panel; and each third extension panel is rotatably connected to a fourth extension panel through the first pivot portion and the second pivot portion.

5. The air guiding duct of claim 4, wherein the first pivot portion is a pivot pin or a pivot hole, and the second pivot portion is a pivot hole or a pivot pin coupled with the first pivot portion.

6. The air guiding duct of claim 2, wherein the first guiding plate further comprises a handle, wherein the handle is connected to a peripheral side of the first air guiding panel.

7. A casing comprising:
   a chassis defines an air intake; and
   an air guiding duct mounted to the chassis and in air communication with the air intake, comprising:
      a first guiding plate comprising:
         a first pivoting portion; and
         a plurality of first extension panels; and
      a second guiding plate comprising:
         a second pivoting portion; and
         a plurality of second extension panels correspondingly align with the plurality of first extension panels;
   wherein the first guiding plate is rotatably connected to the second guiding plate, and the first guiding plate is rotatable between a first position and a second position, the first position is when the first guiding plate aligns with the second guiding plate, each first extension panel contacts a corresponding second extension panel, and the first extension panels and the second extension panels define a plurality of air guiding channels, the second position is where the first guiding plate is tilted at a predetermined angle relative to the second guiding plate.

8. The casing of claim 7, wherein the first guiding plate comprises:
   a first air guiding panel; and
   at least one third extension panel connected to an edge of the first air guiding panel;
   wherein each of the at least one third extension panel comprises a first pivoting portion; the plurality of first extension panels are connected to a same side of the first air guiding panel.

9. The casing of claim 8, wherein the second guiding plate comprises:
   a second air guiding panel; and
   at least one fourth extension panel connected to an edge of the second air guiding panel;
   wherein each of the at least one fourth extension panel comprises a second pivoting portion; the plurality of second extension panels are connected to a same side of the second air guiding panel.

10. The casing of claim 9, wherein the first guiding plate comprises two third extension panels perpendicularly connected to two respective opposing edges of the first air guiding panel; the second guiding plate comprises two fourth extension panels perpendicularly connected to two respective opposing edges of the second air guiding panel;

and each third extension panel is rotatably connected to a fourth extension panel through the first pivot portion and the second pivot portion.

11. The casing of claim 10, wherein the first pivot portion is a pivot pin or a pivot hole, and the second pivot portion is a pivot hole or a pivot pin coupled with the first pivot portion.

12. The casing of claim 8, wherein the first guiding plate further comprises a handle, wherein the handle is connected to a peripheral side of the first air guiding panel.

13. An electronic device comprising:
 a casing comprising:
  a chassis defines an air intake; and
  an air guiding duct mounted to the chassis and in air communication with the air intake, comprising:
   a first guiding plate comprising:
    a first pivoting portion; and
    a plurality of first extension panels; and
   a second guiding plate comprising:
    a second pivoting portion; and
    a plurality of second extension panels corresponding to the plurality of first extension panels;
   wherein the first guiding plate is rotatably connected to the second guiding plate, and the first guiding plate is rotatable between a first position and a second position, the first position is when the first guiding plate aligns with the second guiding plate, each first extension panel contacts a corresponding second extension panel, and the first extension panels and the second extension panels define a plurality of air guiding channels, the second position is where the first guiding plate is tilted at a predetermined angle relative to the second guiding plate;
 a plurality of electronic components; and
 a plurality of cooling fans;
 wherein the plurality of electronic components and the plurality of cooling fans are mounted to the chassis, and the plurality of cooling fans are located between the chassis and the first guiding plate.

14. The electronic device of claim 13, wherein the first guiding plate comprises:
 a first air guiding panel; and
 at least one third extension panel connected to an edge of the first air guiding panel;
 wherein each of the at least one third extension panel comprises a first pivoting portion; the plurality of first extension panels are connected to a same side of the first air guiding panel.

15. The electronic device of claim 14, wherein the second guiding plate comprises:
 a second air guiding panel; and
 at least one fourth extension panel connected to an edge of the second air guiding panel;
 wherein each of the at least one fourth extension panel comprises a second pivoting portion; the plurality of second extension panels are connected to a same side of the second air guiding panel.

16. The electronic device of claim 15, wherein the first guiding plate comprises two third extension panels perpendicularly connected to two respective opposing edges of the first air guiding panel; the second guiding plate comprises two fourth extension panels perpendicularly connected to two respective opposing edges of the second air guiding panel; and each third extension panel is rotatably connected to a fourth extension panel through the first pivot portion and the second pivot portion.

17. The electronic device of claim 16, wherein the first pivot portion and the second pivot portion are a pivot pin and a pivot hole couple with the pivot pin.

18. The electronic device of claim 14, wherein the first guiding plate further comprises a handle, wherein the handle is connected to a peripheral side of the first air guiding panel.

* * * * *

UNITED STATES PATENT AND TRADEMARK OFFICE
CERTIFICATE OF CORRECTION

PATENT NO. : 10,212,847 B1
APPLICATION NO. : 15/952496
DATED : February 19, 2019
INVENTOR(S) : Yan-Ni Yuan et al.

Page 1 of 1

It is certified that error appears in the above-identified patent and that said Letters Patent is hereby corrected as shown below:

On the Title Page

Please replace Item (73) regarding "Assignees" with the following:
(73) Assignees: HONGFUJIN PRECISION ELECTRONICS (Tianjin) CO., LTD.,
Tianjin (CN);

Signed and Sealed this
Twenty-fifth Day of June, 2019

Andrei Iancu
*Director of the United States Patent and Trademark Office*